United States Patent
Nakabayashi et al.

(10) Patent No.: US 10,974,610 B2
(45) Date of Patent: Apr. 13, 2021

(54) CHARGING DEVICE AND CHARGING/DISCHARGING DEVICE

(71) Applicant: Mitsubishi Electric Corporation, Tokyo (JP)

(72) Inventors: Hirokazu Nakabayashi, Tokyo (JP); Yutaka Kuboyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/639,062

(22) PCT Filed: Feb. 18, 2019

(86) PCT No.: PCT/JP2019/005780
§ 371 (c)(1),
(2) Date: Feb. 13, 2020

(87) PCT Pub. No.: WO2020/170294
PCT Pub. Date: Aug. 27, 2020

(65) Prior Publication Data
US 2020/0384872 A1 Dec. 10, 2020

(51) Int. Cl.
*H02J 7/00* (2006.01)
*B60L 53/20* (2019.01)
(Continued)

(52) U.S. Cl.
CPC ............ *B60L 53/20* (2019.02); *B60L 53/14* (2019.02); *B60L 53/18* (2019.02); *G01R 31/36* (2013.01);
(Continued)

(58) Field of Classification Search
CPC .......... B60L 53/20; B60L 53/18; B60L 53/14; B60L 53/30; H01M 10/42; H01M 2220/20; G01R 31/36; H02J 2310/48; Y02T 90/14
(Continued)

(56) References Cited

U.S. PATENT DOCUMENTS

| | | | | |
|---|---|---|---|---|
| 2010/0079105 A1* | 4/2010 | Iwanaga | ................ | B60W 20/13 320/109 |
| 2012/0091958 A1* | 4/2012 | Ichikawa | ................ | B60L 50/16 320/109 |

(Continued)

FOREIGN PATENT DOCUMENTS

| | | |
|---|---|---|
| JP | 2014-155377 A | 8/2014 |
| JP | 2014-217083 A | 11/2014 |

(Continued)

OTHER PUBLICATIONS

International Search Report for PCT/JP2019/005780 (PCT/ISA/210) dated Apr. 23, 2019.
(Continued)

*Primary Examiner* — Zixuan Zhou
(74) *Attorney, Agent, or Firm* — Birch, Stewart, Kolasch & Birch, LLP (57) ABSTRACT

A charging device for charging a storage battery mounted on an electric vehicle includes: a first relay to generate a communication start signal for causing communication between the charging device and the electric vehicle to be started; a cable including a connector for connection to a plug of the electric vehicle at one end to electrically connect the charging device and the electric vehicle; a signal line included in the cable and connected to the first relay; a power supply circuit to pass a current to the signal line when the connector is connected to the plug; a current detection circuit to detect a current flowing in the signal line; and a (Continued)

controller to control the first relay and start the communication when the current detection circuit detects the current.

8 Claims, 11 Drawing Sheets

(51) Int. Cl.
    *B60L 53/14*     (2019.01)
    *B60L 53/18*     (2019.01)
    *G01R 31/36*     (2020.01)
    *H01M 10/42*     (2006.01)
    *B60L 53/30*     (2019.01)

(52) U.S. Cl.
    CPC ............ *H01M 10/42* (2013.01); *B60L 53/30* (2019.02); *H01M 2220/20* (2013.01); *H02J 2310/48* (2020.01); *Y02T 90/14* (2013.01)

(58) Field of Classification Search
    USPC ............................................ 320/109; 701/22
    See application file for complete search history.

(56) References Cited

U.S. PATENT DOCUMENTS

| 2013/0134936 A1* | 5/2013 | Kaneyasu | B60L 53/14 |
| | | | 320/109 |
| 2016/0114693 A1 | 4/2016 | Tsuno | |

FOREIGN PATENT DOCUMENTS

| JP | 2014-217272 A | 11/2014 |
| JP | 2016-28546 A | 2/2016 |
| JP | 2016-86582 A | 5/2016 |
| JP | 2017-46490 A | 3/2017 |
| JP | 2018-7510 A | 1/2018 |
| JP | 2018-74752 A | 5/2018 |
| JP | 2018-85898 A | 5/2018 |

OTHER PUBLICATIONS

Office Action for corresponding German Patent Application No. 11 2019 000 099.3 dated Jan. 7, 2021.

* cited by examiner

CHARGING DEVICE AND CHARGING/DISCHARGING DEVICE

FIELD

The present invention relates to a charging device and a charging/discharging device used for an electric vehicle.

BACKGROUND

In recent years, the charging infrastructure has been spreading with the increase in electric vehicles such as electric vehicles (EVs) and plug-in hybrid vehicles (PHVs). There has also been proposed Plug and Charge (PnC) that automatically starts charging by simply connecting a connector of a charging device to an electric vehicle.

Moreover, storage batteries mounted on electric vehicles are used, together with a charging/discharging device, as a virtual power plant (VPP) to adjust electric power sold and purchased at home in a Vehicle to Home (V2H) system or to adjust the supply and demand balance of commercial power in a Vehicle to Grid (V2G) system. In order to manage the number of storage batteries that can be used by a charging device or charging/discharging device, means for checking a connection state between the charging device or charging/discharging device and the electric vehicle is required.

The configuration and operation of the electric vehicle and the charging device are defined in the guidelines that, for example, the electric vehicle and the charging device include a connector connection checking means, a charge start/stop means, and a communication means. Moreover, specifications define that the electric vehicle and the charging device start to communicate with each other when the connector of the charging device is connected to the electric vehicle and a charge start/stop relay of the charging device is turned on. The charging/discharging device has the function of a discharging device in addition to the function of the charging device, and thus operates similarly to the charging device at the start of charging.

Patent Literature 1 discloses a charging/discharging device including a connector connection checking means for detecting a connection state between the charging/discharging device and an electric vehicle using a connector connection checking line between the electric vehicle and the charging/discharging device.

CITATION LIST

Patent Literature

Patent Literature 1: Japanese Patent Application Laid-open No. 2014-217272

SUMMARY

Technical Problem

However, the connector connection checking means disclosed in Patent Literature 1 detects the connection state between the charging/discharging device and the electric vehicle using a voltage applied to the connector connection checking line from the vehicle. Therefore, for an electric vehicle that does not apply a voltage to the connector connection checking line with concern for a short circuit of power supply of the electric vehicle and ion migration due to moisture adhering to an electrode terminal, for example, there is a problem in that the connection state between the charging/discharging device and the electric vehicle cannot be detected.

The present invention has been made in view of the above, and an object of the present invention is to provide a charging device capable of detecting a connection state with an electric vehicle that does not apply a voltage to a connector connection checking line.

Solution to Problem

To solve the problem and achieve the object described above, a charging device according to an aspect of the present invention is a charging device for charging a storage battery mounted on an electric vehicle, the device including: a first relay to generate a communication start signal for causing communication between the charging device and the electric vehicle to be started; a cable including a connector for connection to a plug of the electric vehicle at one end to electrically connect the charging device and the electric vehicle; a signal line included in the cable and connected to the first relay; a power supply circuit to pass a current to the signal line when the connector is connected to the plug; a current detection circuit to detect a current flowing in the signal line; and a controller to control the first relay and start the communication when the current detection circuit detects the current.

Advantageous Effects of Invention

The charging device according to the present invention has an effect of being able to detect the connection state with the electric vehicle that does not apply a voltage to the connector connection checking line.

DESCRIPTION OF EMBODIMENTS

A charging device and a charging/discharging device according to embodiments of the present invention will be described below in detail with reference to the drawings. Note that the present invention is not limited to the embodiments.

First Embodiment

Figure 1:
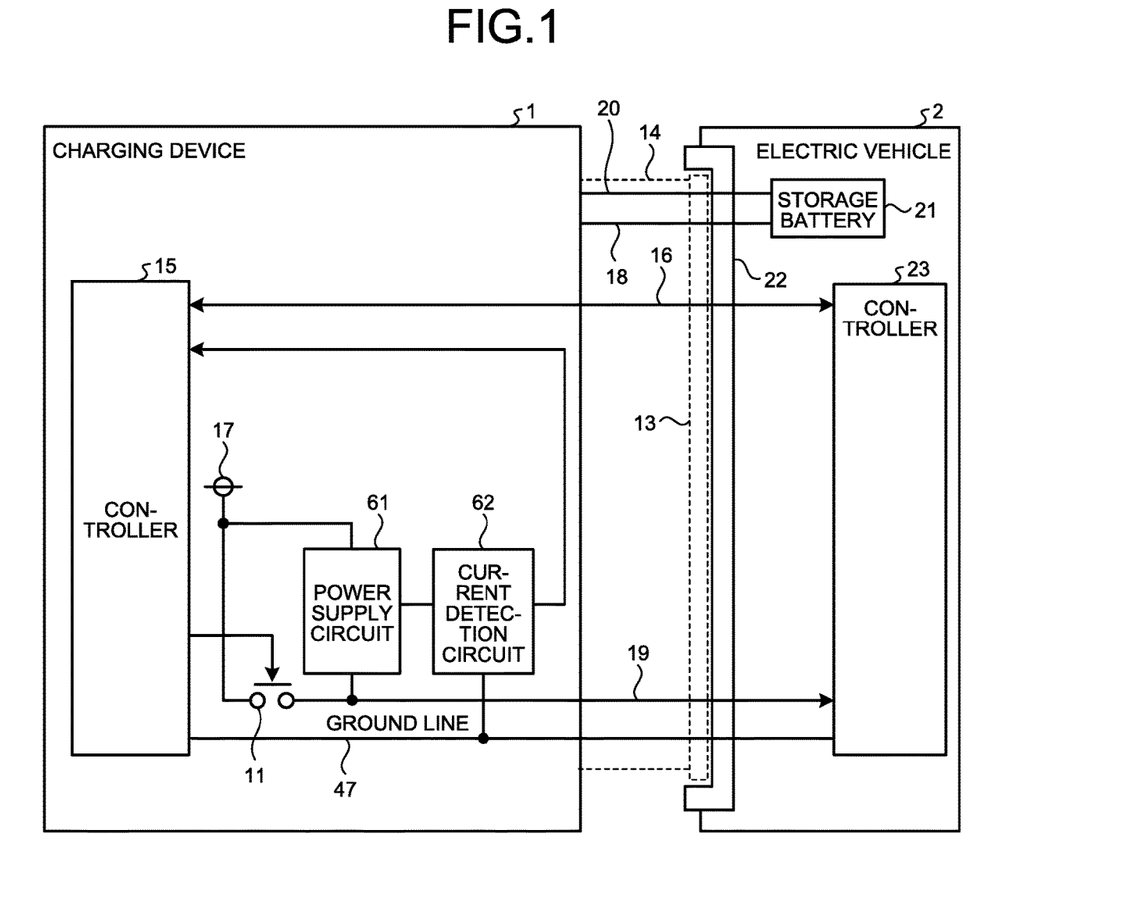
FIG. 1 is a diagram illustrating a state in which an electric vehicle is connected to a charging device according to a first embodiment of the present invention.

FIG. 1 is a diagram illustrating a state in which an electric vehicle 2 is connected to a charging device 1 according to a first embodiment of the present invention. The electric vehicle 2 includes a storage battery 21 and a controller 23. The charging device 1 is a device that charges the storage battery 21 of the electric vehicle 2. Note that the following mainly describes a function of the charging device 1 charging the storage battery 21 of the electric vehicle 2, but the charging device 1 may be a charging/discharging device that has a function of discharging and outputting electric power stored in the storage battery 21. In the case where the charging device 1 has the discharging function, the electric power being discharged and output may be connected to a grid and flow in reverse or may be supplied to a load.

The charging device 1 includes a cable 14 having a connector 13 at one end and being mechanically connected to a casing of the charging device 1 at the other end. The cable 14 includes a communication line 16 for communication with the electric vehicle 2, a first power line 18 and a second power line 20 for charging the electric vehicle 2, a charge start/stop line 19 as a signal line that transmits a communication start signal indicating the start of communication to the electric vehicle 2, and a ground line 47. The cable 14 has a function of electrically connecting the charging device 1 and the electric vehicle 2. The electric vehicle 2 is provided with a plug 22, and the connector 13 is connected to the plug 22. In other words, the charging device 1 and the electric vehicle 2 are connected with each other via the cable 14 and the plug 22.

The charging device 1 includes a power supply 17 and a first relay 11 that generate the communication start signal for causing communication between the charging device 1 and the electric vehicle 2 to be started. The first relay 11 is connected to the power supply 17 at one end, and connected to the charge start/stop line 19 included in the cable 14 at the other end.

The charging device 1 includes a power supply circuit 61 that passes a current to the charge start/stop line 19 when the connector 13 is connected to the plug 22, and a current detection circuit 62 that detects the current flowing to the charge start/stop line 19. The current detection circuit 62 outputs a result of detection to a controller 15.

The charging device 1 further includes the controller 15. The controller 15 controls the operation of the charging device 1. The controller 15 has a function of starting the communication between the charging device 1 and the electric vehicle 2 by controlling the first relay 11 on the basis of the output of the current detection circuit 62. The controller 15 detects a connection state between the charging device 1 and the electric vehicle 2 by starting the communication.

After starting the communication, the controller 15 causes charging of the storage battery 21 of the electric vehicle 2 to be started and controls the operation related to charging by the charging device 1. The controller 15 communicates with the controller 23 of the electric vehicle 2 via the communication line 16 and inputs/outputs signals using a signal line other than the communication line 16, thereby managing the operation related to charging by the charging device 1.

The electric vehicle 2 includes the controller 23 that controls the operation related to charging of the electric vehicle 2. The controller 23 communicates with the controller 15 of the charging device 1 via the communication line 16 included in the cable 14 and inputs/outputs signals using a signal line other than the communication line 16, thereby managing the operation related to charging of the electric vehicle 2.

Figure 2:
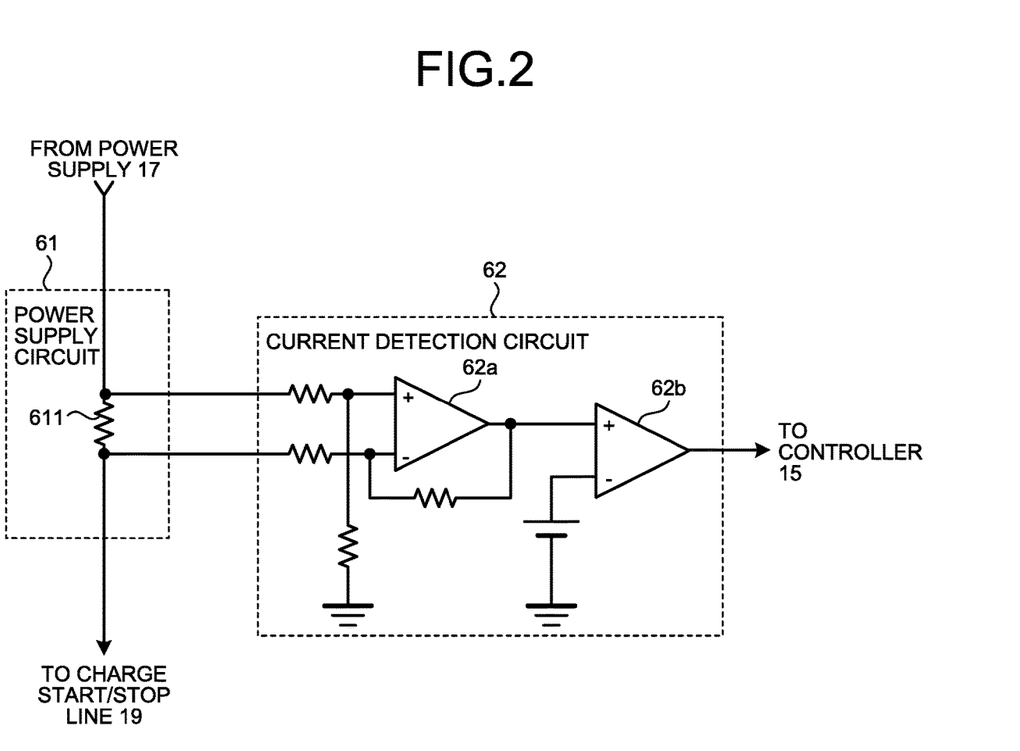
FIG. 2 is a diagram illustrating an example of the configuration of a power supply circuit and a current detection circuit illustrated in FIG. 1.

FIG. 2 is a diagram illustrating an example of the configuration of the power supply circuit 61 and the current detection circuit 62 illustrated in FIG. 1. The power supply circuit 61 includes a shunt resistor 611 that limits the current from the power supply 17 and converts the flowing current into a voltage. When the connector 13 is connected to the plug 22, the charge start/stop line 19 and the ground line 47 are connected, so that the current from the power supply 17 flows through the shunt resistor 611 in the power supply circuit 61, the charge start/stop line 19, and the ground line 47, and a voltage resulting from the flowing current is generated across the shunt resistor 611.

The current detection circuit 62 amplifies the voltage across the shunt resistor 611 by an operational amplifier 62a, and inputs the amplified voltage to a comparator 62b. When the input voltage is higher than a reference voltage, the comparator 62b outputs, to the controller 15, a current detection signal indicating that the current has flowed through the charge start/stop line 19.

Note that the circuit configuration of the power supply circuit 61 and the current detection circuit 62 illustrated in FIG. 2 is an example and is not limited to the example illustrated in FIG. 2. Any circuit configuration may be adopted as long as the value of the current flowing through the charge start/stop line 19 can be detected.

Figure 3:
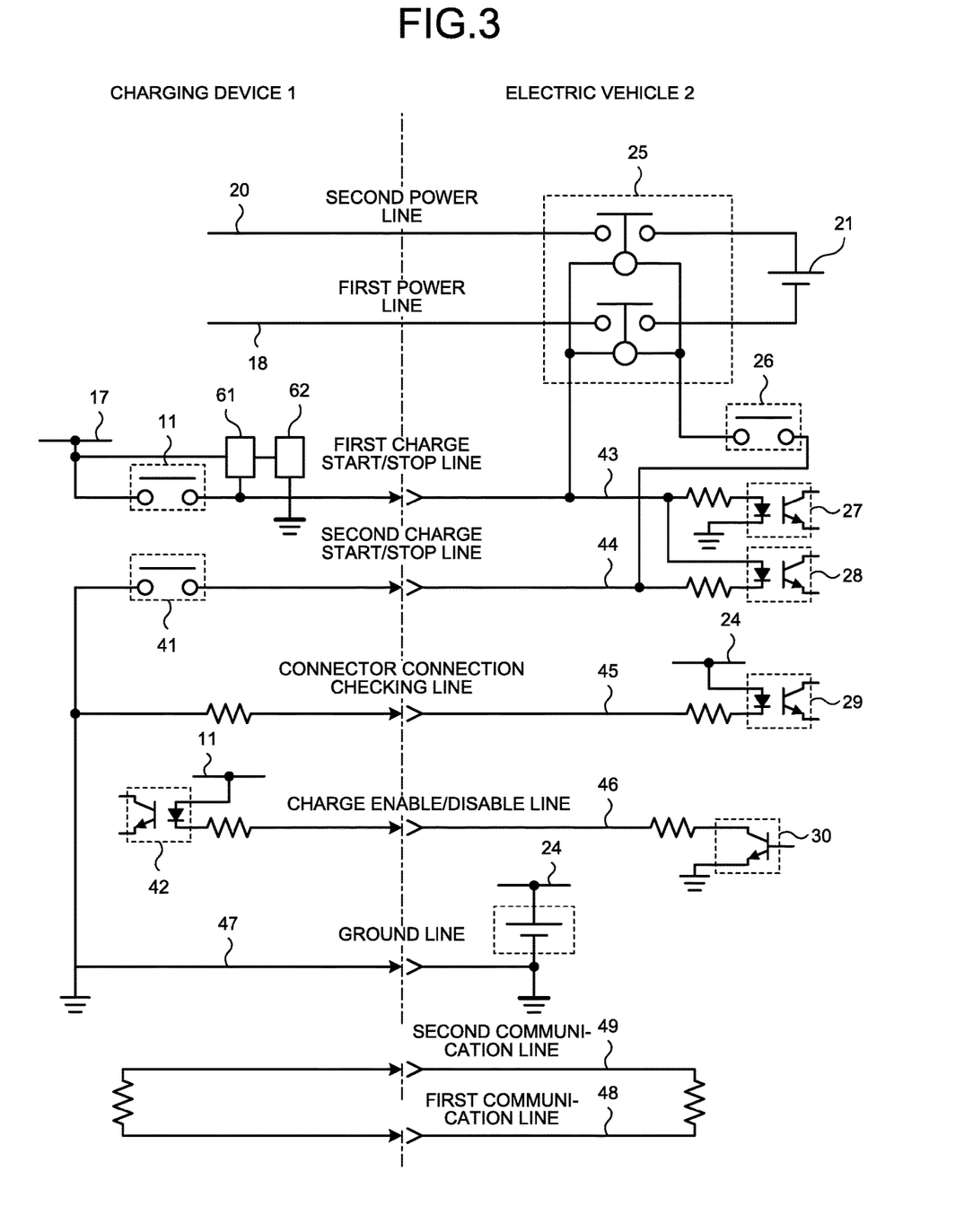
FIG. 3 is a diagram illustrating a state in which the electric vehicle is connected to the charging device illustrated in FIG. 1.

FIG. 3 is a diagram illustrating a state in which the electric vehicle 2 is connected to the charging device 1 illustrated in FIG. 1. The charging device 1 includes the first relay 11, the power supply 17, the power supply circuit 61, and the current detection circuit 62. The charging device 1 further includes a second relay 41 and a charge enable/disable input unit 42. The charging device 1 and the electric vehicle 2 are connected to each other via a first charge start/stop line 43, a second charge start/stop line 44, a connector connection checking line 45, a charge enable/disable line 46, the ground line 47, a first communication line 48, a second communication line 49, the first power line 18, and the second power line 20.

The electric vehicle 2 includes a power supply 24, a vehicle contactor 25, a vehicle contactor drive relay 26, a first relay detector 27, a second relay detector 28, a connection detector 29, and a charge enable/disable output unit 30.

The first charge start/stop line 43, the second charge start/stop line 44, the connector connection checking line 45, the charge enable/disable line 46, the ground line 47, the first communication line 48, the second communication line 49, the first power line 18, and the second power line 20 are included in the cable 14. The first charge start/stop line 43 corresponds to the charge start/stop line 19 in FIG. 1. The first communication line 48 and the second communication line 49 correspond to the communication line 16 in FIG. 1.

The first power line 18 and the second power line 20 are connected to the storage battery 21 via the vehicle contactor 25. The second relay 41 is connected to the second charge start/stop line 44. The first charge start/stop line 43 to which the first relay 11 is connected is connected to the first relay detector 27, and the second charge start/stop line 44 to which the second relay 41 is connected is connected to the second relay detector 28. The connector connection checking line 45 is connected to the connection detector 29. One end of the charge enable/disable line 46 is connected to the charge enable/disable input unit 42, and the other end of the charge enable/disable line 46 is connected to the charge enable/disable output unit 30.

Figure 4:
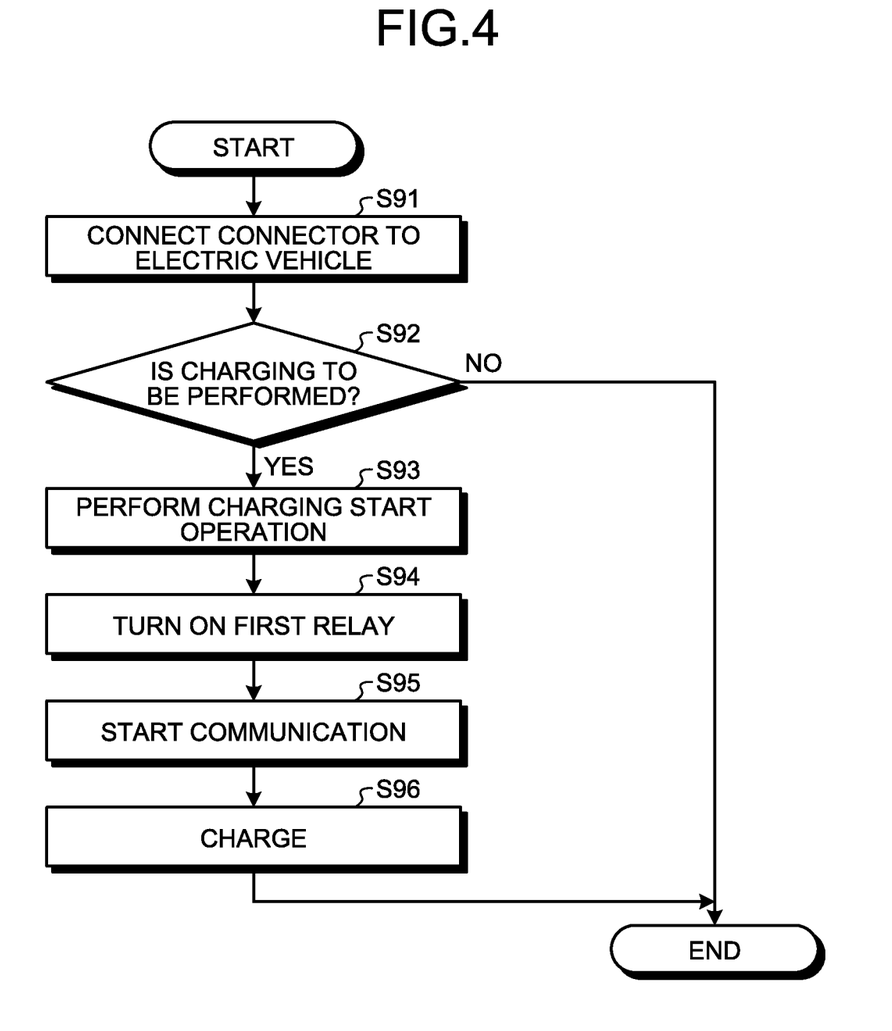
FIG. 4 is a flowchart for explaining an operation of a charging device according to a comparative example of the present invention.

FIG. 4 is a flowchart for explaining an operation of a charging device according to a comparative example of the present invention. Before describing an operation according to the present embodiment, a comparative example will be described in order to facilitate understanding of the features of the present embodiment. Here, each component will be described using the reference numerals illustrated in FIGS. 1 and 3.

First, a user connects the connector 13 of the cable 14 of the charging device 1 to the plug 22 of the electric vehicle 2 (step S91). The user determines whether or not to charge the storage battery 21 (step S92). If determining to charge the storage battery (Yes in step S92), the user performs a charging start operation using a user interface provided on the charging device 1 or a billing system (step S93). The process ends if the user determines not to charge the storage battery 21 (No in step S92).

In response to the charging start operation by the user, the controller 15 of the charging device 1 turns on the first relay 11 (step S94). When the first relay detector 27 of the electric vehicle 2 detects that the first relay 11 is turned on, the controller 23 of the electric vehicle 2 starts communication with the controller 15 via the first communication line 48 and the second communication line 49 (step S95). After the communication between the controller 23 and the controller 15 is started, the controller 15 performs control to start charging the storage battery 21 (step S96).

In the operation of the comparative example described with reference to FIG. 4, the user needs to perform two operations in step S91 and step S93. In the comparative example, a vehicle connection state between the charging device 1 and the electric vehicle 2 is not detected when the user simply connects the connector 13 of the charging device 1 to the plug 22 of the electric vehicle 2.

On the other hand, the operation of the user illustrated in step S93 can be omitted by providing a connector connection checking means that uses the connector connection checking line 45 in the charging device 1. However, in this case, a connection detector needs to be added to the charging device 1, which causes a problem in that the cost of the charging device 1 increases. Moreover, the connector connection checking means that uses the connector connection checking line 45 detects a voltage applied to the connector connection checking line 45 by the electric vehicle 2, so that, for the electric vehicle 2 not applying a voltage to the connector connection checking line 45, the operation by the user in step S93 cannot be omitted, and the user convenience has been compromised.

Figure 5:
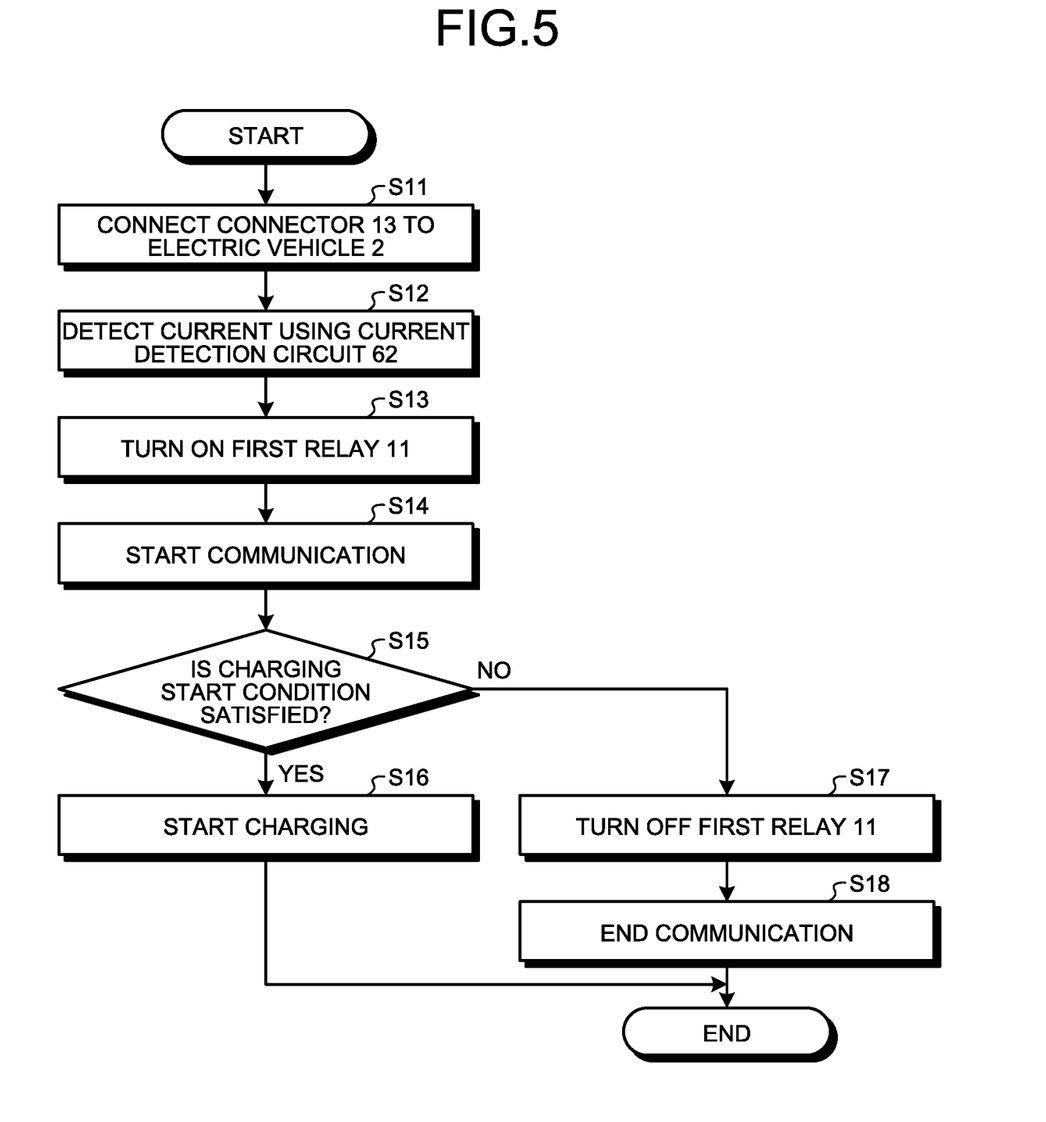
FIG. 5 is a flowchart for explaining an operation of the charging device illustrated in FIG. 1.

FIG. 5 is a flowchart for explaining an operation of the charging device 1 illustrated in FIG. 1. First, a user connects the connector 13 of the cable 14 of the charging device 1 to the plug 22 of the electric vehicle 2 (step S11). When a current flows from the power supply 17 of the charging device 1 to the charge start/stop line 19 and the first relay detector 27 via the shunt resistor 611 in the power supply circuit 61, and the current is larger than or equal to a predetermined threshold, the current detection circuit 62 detects the current flowing in the charge start/stop line 19 (step S12). The current flowing at this time is limited to be smaller than the level detected by the first relay detector 27 by the shunt resistor 611, whereby the first relay detector 27 does not operate.

When the current detection circuit 62 detects the flow of the current larger than or equal to the predetermined threshold, the controller 15 of the charging device 1 turns on the first relay 11 (step S13). The first relay detector 27 of the electric vehicle 2 detects that the first relay 11 is turned on, and the controller 23 of the electric vehicle 2 starts communication with the controller 15 of the charging device 1 via the first communication line 48 and the second communication line 49 (step S14).

The controller 15 of the charging device 1 determines whether or not a charging start condition is satisfied on the basis of information received from the electric vehicle 2 (step S15). In the case of the charging device 1 that can charge the electric vehicle 2 for a fee, such as in an outdoor EV station, for example, the charging start condition is satisfied when billing is completed and charging by the charging device 1 is allowed, when charging is allowed by a charging start operation performed in advance by the user, or the like. If determining that the charging start condition is satisfied (Yes in step S15), the controller 15 performs control to cause charging of the storage battery 21 to be started (step S16).

If determining that the charging start condition is not satisfied (No in step S15), the controller 15 of the charging device 1 turns off the first relay 11 (step S17). When the first relay detector 27 of the electric vehicle 2 detects that the first relay 11 is turned off, the controller 23 of the electric vehicle 2 then ends the communication with the controller 15 (step S18).

In the operation illustrated in FIG. 5, the user performs one operation in step S11 to be able to implement PnC that starts charging when the user simply connects the connector 13 of the charging device 1 to the plug 22 of the electric vehicle 2. Furthermore, when the user simply connects the connector 13 to the plug 22, the controller 23 of the electric vehicle 2 starts communication with the controller 15 of the charging device 1, so that the controller 15 detects a connection state between the charging device 1 and the electric vehicle 2, thereby being able to notify the user of information indicating the connection state.

Figure 6:
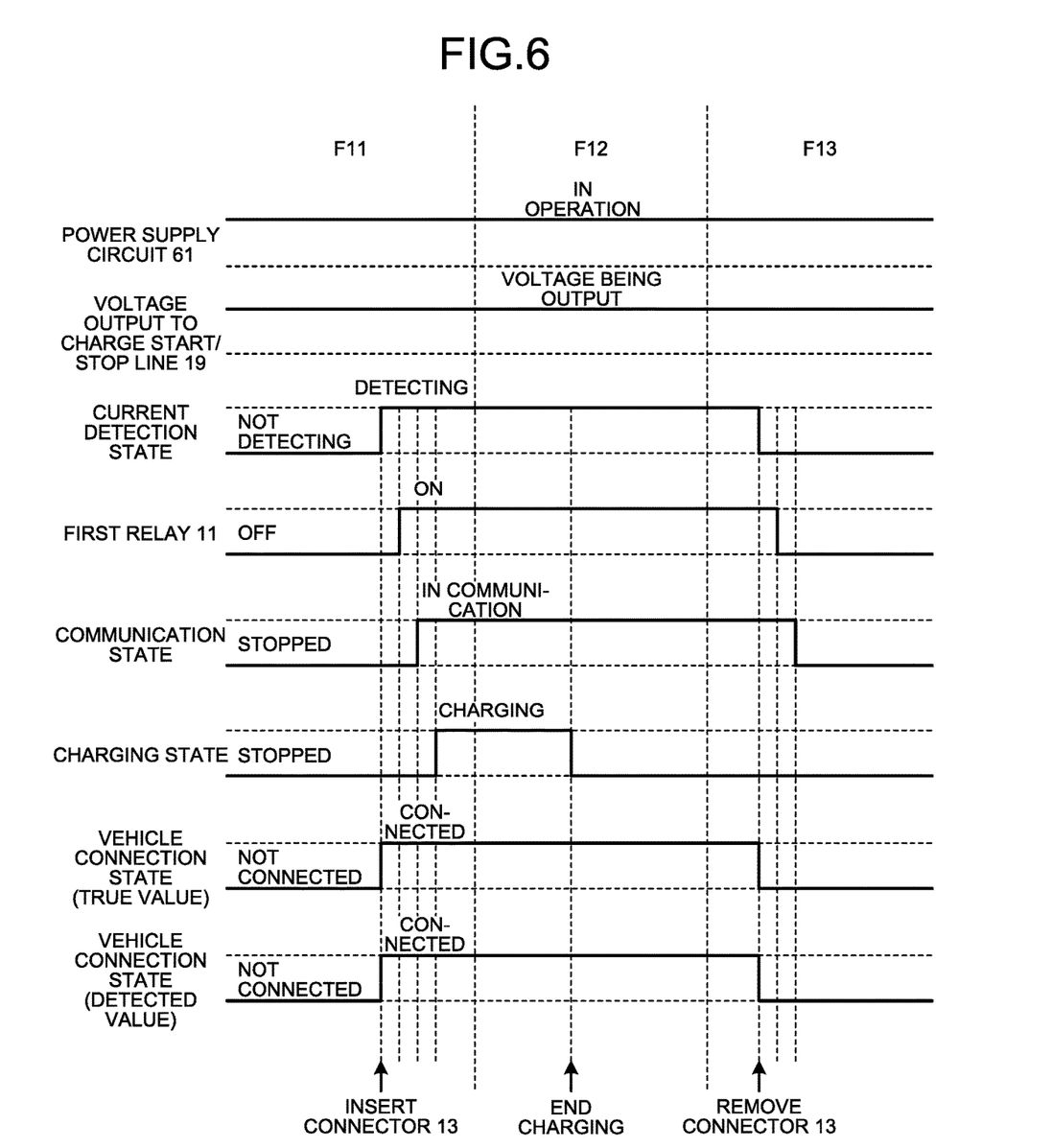
FIG. 6 is a chart illustrating a relationship between the operations of the charging device and the electric vehicle illustrated in FIG. 1 and a state of each unit.

FIG. 6 is a chart illustrating a relationship between the operations of the charging device 1 and the electric vehicle 2 illustrated in FIG. 1 and a state of each unit. A "communication state" in FIG. 6 indicates a communication state between the controller 15 of the charging device 1 and the controller 23 of the electric vehicle 2, and a "charging state" indicates a charging state of the storage battery 21. A "vehicle connection state (true value)" in FIG. 6 indicates an actual connection state between the charging device 1 and the electric vehicle 2, and a "vehicle connection state (detected value)" indicates a result of detection of the connection state between the charging device 1 and the electric vehicle 2.

The controller 15 of the charging device 1 continuously outputs an ON command signal to the power supply circuit 61, and the power supply circuit 61 keeps being turned on based on the ON command signal. Also, by turning on the power supply circuit 61, a voltage from the power supply circuit 61 is continuously output to the charge start/stop line 19.

When the connector 13 of the charging device 1 is inserted into the plug 22 of the electric vehicle 2 and connected to the plug 22, the current detection circuit 62 detects the current flowing in the charge start/stop line 19 and the current detection state becomes "detecting". Then, the current detection circuit 62 outputs a current detection signal. On the basis of the current detection signal output from the current detection circuit 62, the controller 15 controls the first relay 11 to turn on the first relay 11. When the first relay 11 is turned on, a communication start signal is input to the electric vehicle 2 using the charge start/stop line 19, so that communication is started between the controller 15 of the charging device 1 and the controller 23 of the electric vehicle 2, and the communication state becomes "in communication".

When communication is started between the controller 15 and the controller 23, the controller 15 detects the connection state between the charging device 1 and the electric vehicle 2 and causes charging of the storage battery 21 to be started, whereby the charging state becomes "charging" (phase F11).

When charging of the storage battery 21 is completed and the charging state becomes "stopped", the controller 15 of the charging device 1 keeps the first relay 11 turned on and continues communication with the electric vehicle 2 (phase F12). At this time, the charging device 1 maintains the connection state between the charging device 1 and the electric vehicle 2.

When the connector 13 of the charging device 1 is removed from the plug 22, a result of detection by the current detection circuit 62 becomes "not detecting", so that the controller 15 turns off the first relay 11 and stops the communication with the electric vehicle 2 (phase F13).

As described above, the charging device 1 according to the first embodiment of the present invention can detect the connection state between the charging device 1 and the electric vehicle 2 even in the case where the electric vehicle 2 does not apply a voltage to the connector connection checking line 45. Furthermore, when the connector 13 of the charging device 1 is connected to the electric vehicle 2, the charging device 1 can start charging the storage battery 21 without a user operation.

Second Embodiment

In the first embodiment described above, the power supply circuit 61 includes only the shunt resistor 611. Thus, when the connector 13 of the cable 14 of the charging device 1 is not connected to the plug 22 of the electric vehicle 2, the voltage of the power supply 17 continues to be output to the charge start/stop line 19 of the connector 13, whereby there has been a concern about a short circuit of the power supply 17 and ion migration due to moisture adhering to an electrode terminal in outdoor use. Thus, in the charging device 1 according to a second embodiment, the power supply circuit 61 includes a constant current circuit.

Figure 7:
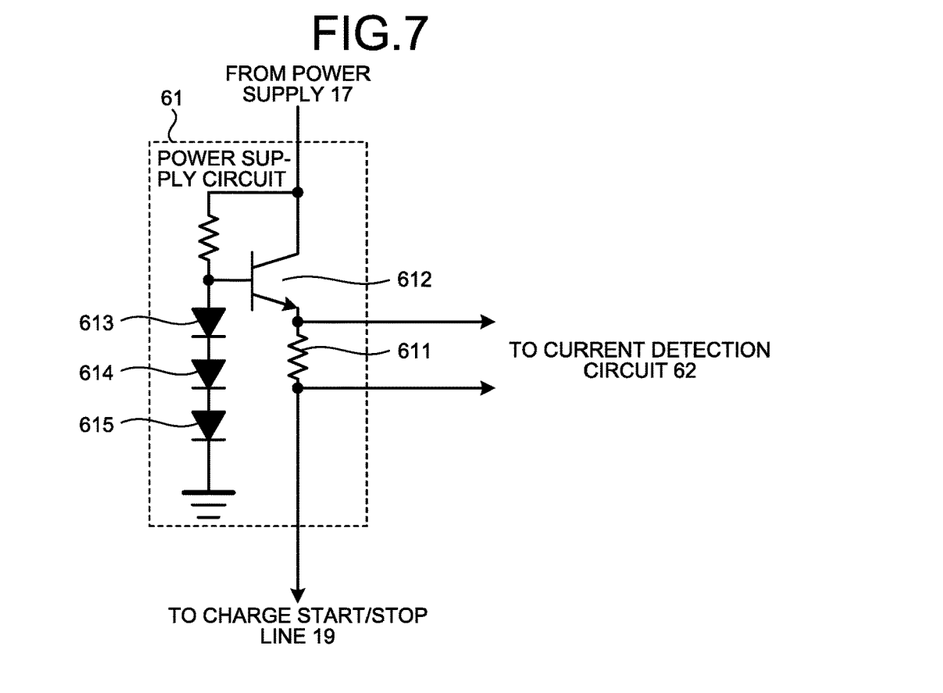
FIG. 7 is a diagram illustrating a configuration of the power supply circuit of the charging device according to a second embodiment of the present invention.

FIG. 7 is a diagram illustrating a configuration of the power supply circuit 61 of the charging device 1 according to the second embodiment of the present invention. In the present embodiment, the power supply circuit 61 includes the shunt resistor 611, a transistor 612, and diodes 613, 614, and 615. One end of the shunt resistor 611 is connected to an emitter of the transistor 612, and the other end of the shunt resistor 611 is connected to the charge start/stop line 19. A collector of the transistor 612 is connected to the power supply 17, and a base of the transistor 612 is connected to an anode of the diode 613. A cathode of the diode 613 is connected to an anode of the diode 614, a cathode of the diode 614 is connected to an anode of the diode 615, and a cathode of the diode 615 is connected to circuit GND. The power supply circuit 61 has the configuration of a so-called emitter follower circuit.

Here, the diodes 613 and 614 are silicon diodes and the diode 615 is a Schottky barrier diode so that a current can flow to the first relay detector 27 when the connector 13 of the cable 14 of the charging device 1 is connected to the plug 22 of the electric vehicle 2 and that the voltage of the charge start/stop line 19 is as low as possible when the connector 13 is not connected to the plug 22 of the electric vehicle 2. The other components are similar to those of the first embodiment and thus will not be described.

In the second embodiment, the emitter follower circuit of the power supply circuit 61 operates such that a sum of a base-emitter voltage of the transistor 612, a voltage across the shunt resistor 611, and a voltage drop of the first relay detector 27 coincides with a sum of forward voltages of the diodes 613, 614, and 615. At this time, the base-emitter voltage of the transistor 612 is substantially equal to the forward voltage of the diode 613 which is the silicon diode, so that the circuit operates such that a sum of the voltage across the shunt resistor 611 and the voltage drop due to the first relay detector 27 substantially coincides with a sum of the forward voltages of the diodes 614 and 615. Since the voltage across the shunt resistor 611 is equal to a product of the value of current flowing to the charge start/stop line 19 and a resistance value of the shunt resistor 611, the current flowing to the charge start/stop line 19 is limited to a certain value and output.

Note that although the three diodes 613, 614, and 615 are connected in series in the example illustrated in FIG. 7, a change can be made to the configuration as appropriate, such as changing the number of diodes in series or replacing any of the diodes with a Zener diode, depending on the size of the shunt resistor 611 and the magnitude of the voltage drop by the first relay detector 27.

In the second embodiment as well, the controller 15 of the charging device 1 continuously outputs the ON command signal to the power supply circuit 61, and the power supply circuit 61 keeps being turned on based on the ON command signal. As a result, the voltage from the power supply circuit 61 is continuously output to the charge start/stop line 19.

Moreover, in the second embodiment, when the connector 13 of the cable 14 of the charging device 1 is connected to the plug 22 of the electric vehicle 2, the current that is limited and output by the power supply circuit 61 flows to the first relay detector 27 via the charge start/stop line 19. The subsequent operations are similar to those of the first embodiment.

As described above, like the first embodiment, the charging device 1 according to the second embodiment can detect the connection state between the charging device 1 and the electric vehicle 2 even in the case where the electric vehicle 2 does not apply a voltage to the connector connection checking line 45. Furthermore, when the connector 13 of the charging device 1 is connected to the plug 22 of the electric vehicle 2, the charging device 1 can start charging the storage battery 21 without the need for a user operation.

Also, in the second embodiment, the power supply circuit 61 includes the constant current circuit, so that the output current is limited and an excessive short circuit current does not flow even in the event of an output short circuit of the connector 13. Moreover, when the connector 13 of the cable 14 of the charging device 1 is not connected to the plug 22 of the electric vehicle 2, the voltage output to the charge start/stop line 19 of the connector 13 is kept at about the level corresponding to the forward voltage of the diode 614 that is the Schottky barrier diode, whereby the effect of reducing ion migration due to moisture adhesion can be enhanced.

Third Embodiment

Figure 8:
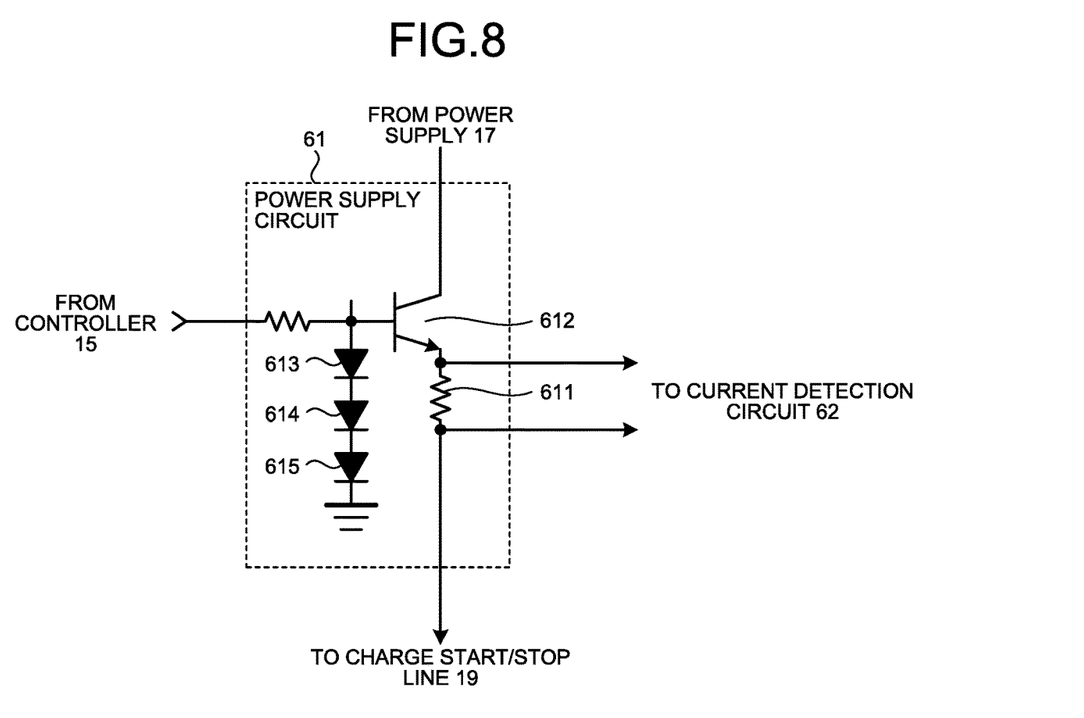
FIG. 8 is a diagram illustrating a configuration of the power supply circuit of the charging device according to a third embodiment of the present invention.

FIG. 8 is a diagram illustrating a configuration of the power supply circuit 61 of the charging device 1 according to a third embodiment of the present invention. In the third embodiment, the base of the transistor 612 in the power supply circuit 61 of the second embodiment is connected to the controller 15 via a base resistor so that the controller 15 can control on/off of the transistor 612. The power supply circuit 61 according to the third embodiment is similar to that of the second embodiment except for the above point, and the charging device 1 according to the third embodiment has the configuration similar to that of the first embodiment except for the power supply circuit 61, whereby the description thereof will be omitted here.

Figure 9:
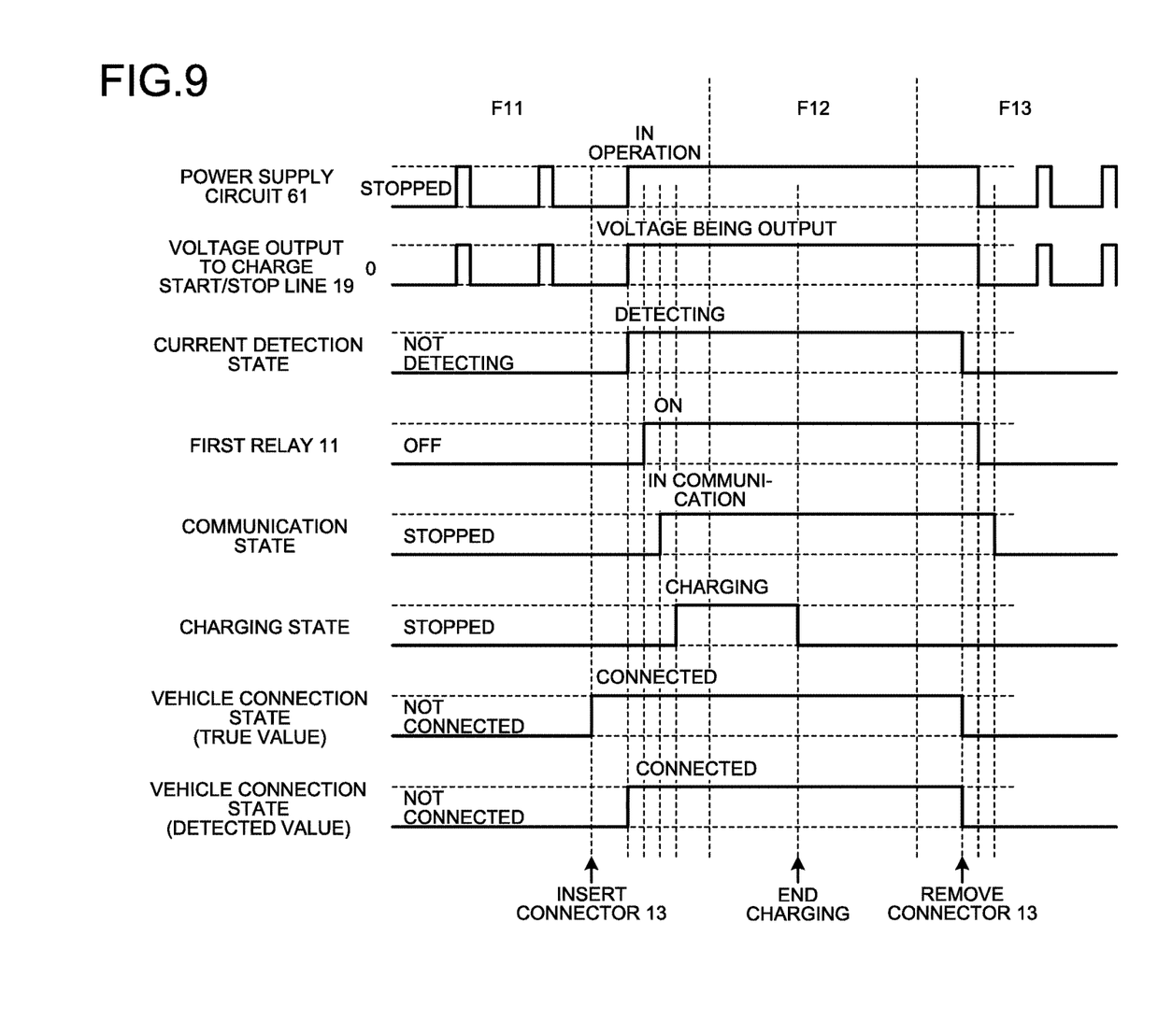
FIG. 9 is a chart illustrating a relationship between the operations of the charging device and the electric vehicle and a state of each unit, the charging device including the power supply circuit illustrated in FIG. 8.

FIG. 9 is a chart illustrating a relationship between the operations of the charging device 1 and the electric vehicle 2 and a state of each unit, the charging device 1 including the power supply circuit 61 illustrated in FIG. 8. The controller 15 of the charging device 1 periodically outputs a short-time ON command signal, that is, an intermittent ON command signal, to the power supply circuit 61. In response to the ON command signal, the transistor 612 of the power supply circuit 61 is periodically turned on only for a short time. In other words, the power supply circuit 61 is periodically turned on and off repeatedly and operates intermittently. In this case, a voltage is output to the charge start/stop line 19 when the power supply circuit 61 is on, and zero voltage is output to the charge start/stop line 19 when the power supply circuit 61 is off.

When the connector 13 of the charging device 1 is inserted into the plug 22 of the electric vehicle 2, a current flows to the charge start/stop line 19 at the timing when the power supply circuit 61 is turned on. Once the current flows to the charge start/stop line 19, the current detection circuit 62 detects that the current has flowed to the charge start/stop line 19 and outputs a current detection signal, whereby the current detection state becomes "detecting".

When the current detection signal is output, the controller 15 outputs a continuous ON command signal to the power supply circuit 61 and turns on the first relay 11. Once the first relay 11 is turned on, a communication start signal is output, so that communication with the controller 23 of the electric vehicle 2 is started and the communication state becomes "in communication". After communication with the controller 23 of the electric vehicle 2 is started, the controller 15 detects the connection state between the charging device 1 and the electric vehicle 2 and causes charging of the storage battery 21 to be started (phase F11).

When charging of the storage battery 21 is completed, the controller 15 of the charging device 1 keeps the first relay 11 turned on and continues communication with the controller 23 of the electric vehicle 2. At this time, the charging device 1 maintains the connection state between the charging device 1 and the electric vehicle 2 (phase F12).

After the connector 13 of the charging device 1 is removed from the plug 22 of the electric vehicle 2, the controller 15 of the charging device 1 turns off the first relay 11 on the basis of a detection state detected by the current detection circuit 62, stops the power supply circuit 61, and stops communication with the electric vehicle 2. After turning off the first relay 11, the controller 15 periodically outputs a short-time ON command signal to the power supply circuit 61 (phase F13).

As described above, like the first and second embodiments, the third embodiment of the present invention can also detect the connection state between the charging device 1 and the electric vehicle 2 even in the case where the electric vehicle 2 does not apply a voltage to the connector connection checking line 45. Furthermore, when the connector 13 of the charging device 1 is connected to the plug 22 of the electric vehicle 2, the charging device 1 can start charging the storage battery 21 without the need for a user operation. Also, the power supply circuit 61 includes the constant current circuit, so that the output current is limited and an excessive short circuit current flow can be reduced or prevented even in the event of an output short circuit of the connector 13 of the cable 14 of the charging device 1.

Moreover, in the third embodiment, the power supply circuit 61 is operated for a shorter time when the connector 13 of the charging device 1 is not connected to the plug 22 of the electric vehicle 2, so that a voltage is output to the charge start/stop line 19 of the connector 13 for a shorter time when the connector 13 of the charging device 1 is not connected to the plug 22 of the electric vehicle 2, and the effect of reducing ion migration due to moisture adhesion can be further enhanced.

Fourth Embodiment

Figure 10:
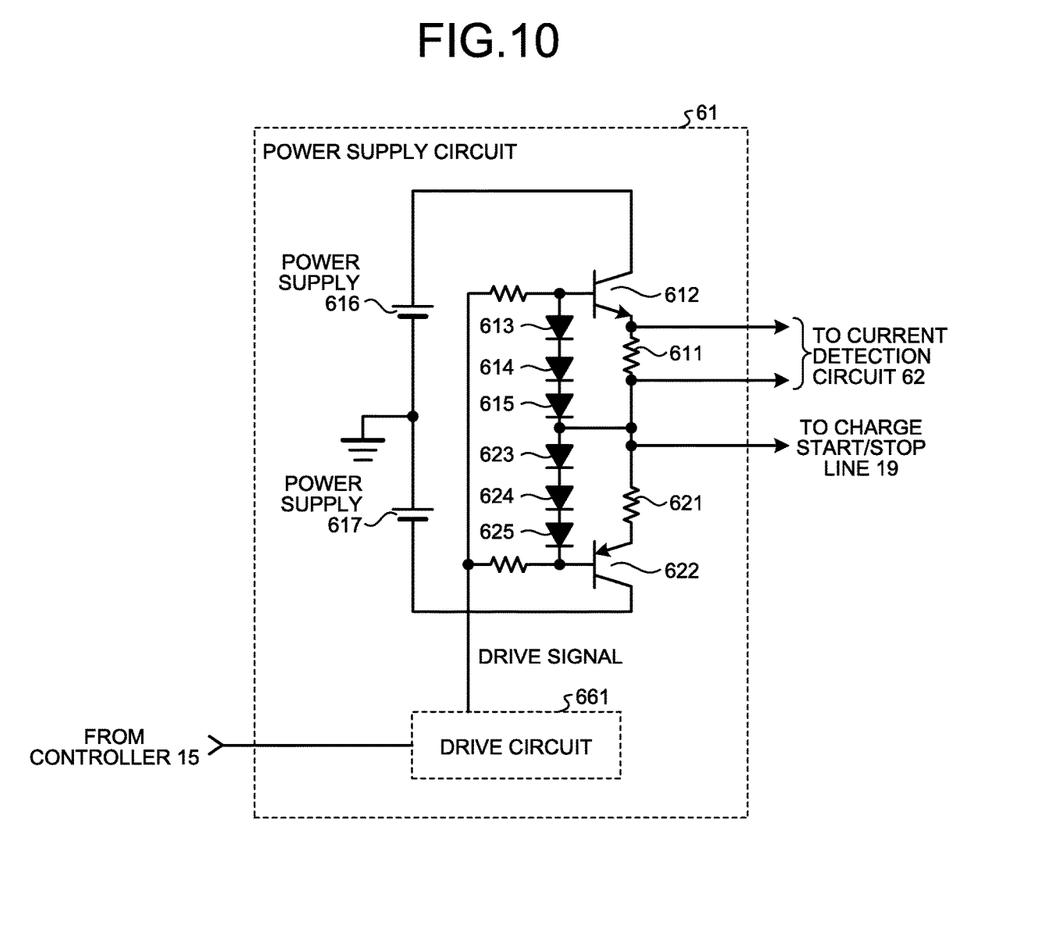
FIG. 10 is a diagram illustrating a configuration of the power supply circuit of the charging device according to a fourth embodiment of the present invention.

FIG. 10 is a diagram illustrating a configuration of the power supply circuit 61 of the charging device 1 according to a fourth embodiment of the present invention. In the fourth embodiment, in addition to a first constant current circuit including the shunt resistor 611, the transistor 612, and the diodes 613, 614, and 615, the power supply circuit 61 further includes a second constant current circuit connected in series to the first constant current circuit. The second constant current circuit includes a shunt resistor 621, a transistor 622, and diodes 623, 624, and 625. The power supply circuit 61 forms a push-pull circuit with a so-called emitter follower.

A power supply 616 and a power supply 617 are connected in series, and the midpoint thereof is connected to circuit GND. A positive terminal of the power supply 616 is connected to the collector of the transistor 612, and a negative terminal of the power supply 617 is connected to a collector of the transistor 622. A signal from the controller 15 is connected to a drive circuit 661, and an output of the drive circuit 661 is connected to the base of the transistor 612 and a base of the transistor 622 via base resistors. The other configurations are similar to those of the first to third embodiments.

Figure 11:
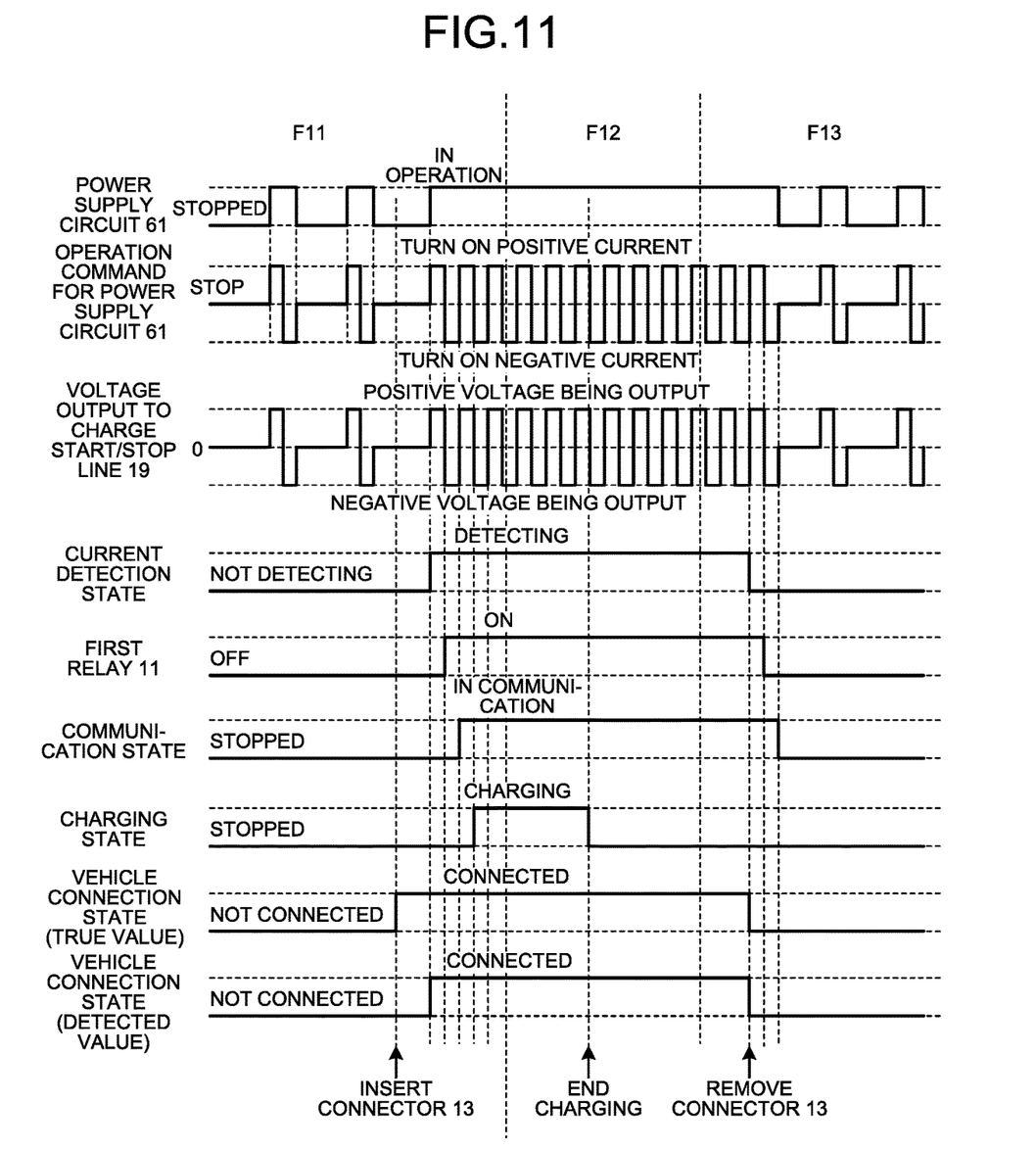
FIG. 11 is a chart illustrating a relationship between the operations of the charging device and the electric vehicle and a state of each unit, the charging device including the power supply circuit illustrated in FIG. 10.

FIG. 11 is a chart illustrating a relationship between the operations of the charging device 1 and the electric vehicle 2 and a state of each unit, the charging device 1 including the power supply circuit 61 illustrated in FIG. 10. The controller 15 of the charging device 1 periodically inputs an operation command to the power supply circuit 61 only for a short time. In the fourth embodiment, the operation command includes a positive current ON command indicating turn-on of a positive current and a negative current ON command indicating turn-on of a negative current. The drive circuit 661 of the power supply circuit 61 drives the transistors 612 and 622 on the basis of the operation command.

When the connector 13 of the charging device 1 is connected to the plug 22 of the electric vehicle 2, a current flows to the charge start/stop line 19 at a timing when the operation command is input next, and the current detection circuit 62 detects this current and outputs a current detection signal. In response to the output of the current detection signal, the controller 15 continuously inputs the operation command to the power supply circuit 61.

When the operation command is the positive current ON command, the drive circuit 661 of the power supply circuit 61 drives the transistor 612 such that a positive voltage is applied to the charge start/stop line 19 and the first relay detector 27 via the transistor 612 and the shunt resistor 611, a current flows in a positive direction, that is, in a direction of output as viewed from the power supply circuit 61, and the current detection circuit 62 detects this current. The current flowing at this time is limited by the transistor 612 and the shunt resistor 611 to a level lower than the level detected by the first relay detector 27, whereby the first relay detector 27 does not operate.

When the operation command is the negative current ON command, the drive circuit 661 drives the transistor 622 such that a negative voltage is applied to the charge start/stop line 19 and the first relay detector 27 via the shunt resistor 621 and the transistor 622. In the present embodiment, the negative current flowing into the power supply circuit 61 does not flow due to the action of a diode in the first relay detector 27. Therefore, the output voltage when the output is open is periodically switched between positive and negative.

In response to the output of the current detection signal, the controller 15 turns on the first relay 11. The rest is similar to the third embodiment and thus will not be described.

As described above, like the first to third embodiments, the fourth embodiment of the present invention can also detect the connection state between the charging device 1 and the electric vehicle 2 even in the case where the electric vehicle 2 does not apply a voltage to the connector connection checking line 45. Furthermore, when the connector 13 of the charging device 1 is connected to the plug 22 of the electric vehicle 2, the charging device 1 can start charging the storage battery 21 without the need for a user operation. Also, the power supply circuit 61 includes the constant current circuit, so that the output current is limited and an excessive short circuit current flow can be reduced or prevented even in the event of an output short circuit of the connector 13 of the cable 14 of the charging device 1.

Moreover, the power supply circuit 61 is operated for a shorter time when the connector 13 of the charging device 1 is not connected to the plug 22 of the electric vehicle 2, so that a voltage is output to the charge start/stop line 19 of the connector 13 for a shorter time when the connector 13 of the charging device 1 is not connected to the plug 22 of the electric vehicle 2, and the effect of reducing ion migration due to moisture adhesion can be further enhanced as with the third embodiment.

Furthermore, the voltage output to the charge start/stop line 19 of the connector 13 is alternating current in the fourth embodiment, whereby the effect of reducing ion migration due to moisture adhesion can be further enhanced when the connector 13 of the charging device 1 is not connected to the plug 22 of the electric vehicle 2.

In the first to fourth embodiments, the charging device 1 has been described. The charging device 1 in the first to fourth embodiments may be replaced by a charging/discharging device that charges/discharges the storage battery 21 of the electric vehicle 2. In the case of the charging/discharging device, the number of the storage batteries 21 that can be used can be managed on the basis of connection information between the charging/discharging device and the electric vehicle 2 acquired by the charging/discharging device in the V2H system or the V2G system.

Figure 12:
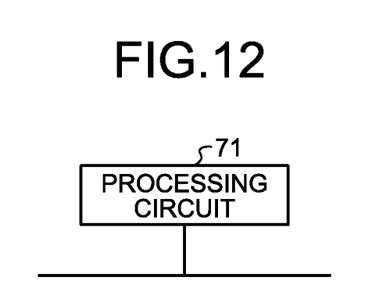
FIG. 12 is a diagram illustrating a processing circuit that implements at least some of the components making up a first relay and a controller included in the charging device according to the first to fourth embodiments.

FIG. 12 is a diagram illustrating a processing circuit 71 that implements at least some of the components making up the first relay 11 and the controller 15 included in the charging device 1 according to the first to fourth embodiments. That is, at least some of the functions of the first relay 11 and the controller 15 may be implemented by the processing circuit 71.

The processing circuit 71 is dedicated hardware. The processing circuit 71 is, for example, a single circuit, a complex circuit, a programmed processor, a parallel-programmed processor, an application specific integrated circuit (ASIC), a field programmable gate array (FPGA), or a combination of those. A part of the first relay 11 and the controller 15 may be dedicated hardware separate from the rest.

Figure 13:
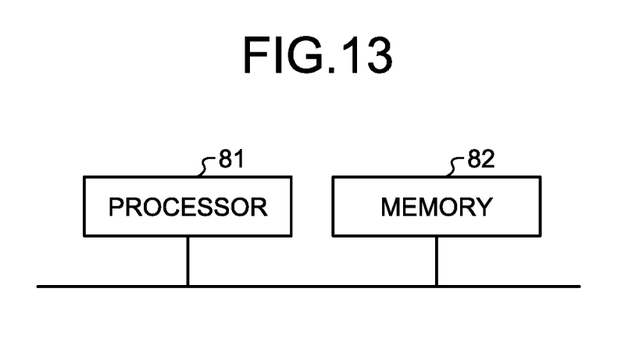
FIG. 13 is a diagram illustrating a processor that implements at least some of the functions of the first relay and the controller included in the charging device according to the first to fourth embodiments.

FIG. 13 is a diagram illustrating a processor 81 that implements at least some of the functions of the first relay 11 and the controller 15 included in the charging device 1 according to the first to fourth embodiments. That is, at least some of the functions of the first relay 11 and the controller 15 may be implemented by the processor 81 that executes a program stored in a memory 82.

The processor 81 is a central processing unit (CPU), a processing unit, an arithmetic unit, a microprocessor, a microcomputer, or a digital signal processor (DSP). FIG. 13 also illustrates the memory 82.

In the case where at least some of the functions of the first relay 11 and the controller 15 are implemented by the processor 81, the some of the functions are implemented by the processor 81 and software, firmware, or a combination of software and firmware.

The software or firmware is described as a program and stored in the memory 82. The processor 81 reads and executes the program stored in the memory 82, thereby implementing at least some of the functions of the first relay 11 and the controller 15.

In the case where at least some of the functions of the first relay 11 and the controller 15 are implemented by the processor 81, the charging device 1 includes the memory 82 for storing a program that results in execution of steps executed by at least a part of the first relay 11 and the controller 15. In other words, the program stored in the memory 82 causes a computer to execute a procedure or method executed by at least a part of the first relay 11 and the controller 15.

The memory 82 includes, for example, a non-volatile or volatile semiconductor memory such as a random access memory (RAM), a read only memory (ROM), a flash memory, an erasable programmable read only memory (EPROM), or an electrically erasable programmable read only memory (EEPROM (registered trademark)), a magnetic disk, a flexible disk, an optical disk, a compact disc, a mini disc, or a digital versatile disk (DVD).

Some of a plurality of functions of the first relay 11 and the controller 15 may be implemented by dedicated hardware, while the rest of the plurality of functions may be implemented by software or firmware. The plurality of functions of the first relay 11 and the controller 15 can thus be implemented by hardware, software, firmware, or a combination of these.

The configurations illustrated in the above embodiments merely illustrate examples of the content of the present invention, and can thus be combined with another known technique or partially omitted and/or modified without departing from the scope of the present invention.

REFERENCE SIGNS LIST 1 charging device; 2 electric vehicle; 11 first relay; 13 connector; 14 cable; 15, 23 controller; 16 communication line; 17, 24, 616, 617 power supply; 18 first power line; 19 charge start/stop line; 20 second power line; 21 storage battery; 22 plug; 25 vehicle contactor; 26 vehicle contactor drive relay; 27 first relay detector; 28 second relay detector; 29 connection detector; 30 charge enable/disable output unit; 41 second relay; 42 charge enable/disable input unit; 43 first charge start/stop line; 44 second charge start/stop line; 45 connector connection checking line; 46 charge enable/disable line; 47 ground line; 48 first communication line; 49 second communication line; 61 power supply circuit; 62 current detection circuit; 71 processing circuit; 81 processor; 82 memory; 611, 621 shunt resistor; 612, 622 transistor; 613, 614, 615, 623, 624, 625 diode; 661 drive circuit.

The invention claimed is:

1. A charging device for charging a storage battery mounted on an electric vehicle, the charging device comprising:
    a first relay to generate a communication start signal for causing communication between the charging device and the electric vehicle to be started;
    a cable including a connector for connection to a plug of the electric vehicle at one end to electrically connect the charging device and the electric vehicle;
    a communication line included in the cable for communication between the charging device and the electric vehicle;
    a signal line included in the cable and connected to the first relay for transmission of the communication start signal to the electric vehicle;
    a power supply circuit to pass a current to the signal line only in a state in which the connector is connected to the plug;
    a current detection circuit to detect a value of a current flowing in the signal line; and
    a controller, in response to detection by the current detection circuit of a current value which is larger than or equal to a predetermined threshold, to control the first relay to start the communication such that the communication start signal generated by the first relay is transmitted through the signal line to the electric vehicle and causes the communication between the charging device and the electric vehicle to be started through the communication line.

2. The charging device according to claim 1, wherein when the value of the current is larger than or equal to the predetermined threshold, the controller determines that the charging device and the electric vehicle are connected.

3. The charging device according to claim 1, wherein, when the value of the current is larger than or equal to the predetermined threshold, the controller causes charging the electric vehicle to be started after starting the communication.

4. The charging device according to claim 1, wherein the power supply circuit is a constant current power supply circuit that limits a current flowing to the signal line to a predetermined current value.

5. The charging device according to claim 4, wherein the constant current power supply circuit periodically switches an output voltage at a time when an output is open to positive and negative.

6. The charging device according to claim 1, wherein the controller causes the power supply circuit to operate intermittently and detects a state in which the charging device and the electric vehicle are not connected.

7. The charging device according to claim 6, wherein the controller causes the power supply circuit to operate intermittently and causes the power supply circuit to operate continuously when the value of the current is larger than or equal to the predetermined threshold.

8. A charging/discharging device comprising
    the charging device according to claim 1, wherein
    the charging/discharging device further includes a function of discharging and outputting electric power stored in the storage battery.

* * * * *